(12) United States Patent
Kang et al.

(10) Patent No.: US 7,759,718 B2
(45) Date of Patent: Jul. 20, 2010

(54) METHOD MANUFACTURING CAPACITOR DIELECTRIC

(75) Inventors: Sang-yeol Kang, Suwon-si (KR); Jong-cheol Lee, Gangdong-gu (KR); Ki-vin Im, Seongnam-si (KR); Jae-hyun Yeo, Buchoeon-si (KR); Hoon-sang Choi, Seocho-gu (KR); Eun-ae Chung, Dongdaemun-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 11/865,869

(22) Filed: Oct. 2, 2007

(65) Prior Publication Data
US 2008/0122044 A1 May 29, 2008

(30) Foreign Application Priority Data
Nov. 24, 2006 (KR) ............ 10-2006-0117179

(51) Int. Cl.
*H01L 29/76* (2006.01)
*H01L 29/94* (2006.01)
*H01L 31/119* (2006.01)

(52) U.S. Cl. .......... 257/310; 257/E21.01; 257/E21.281; 438/240; 438/778; 438/785

(58) Field of Classification Search ........... 257/310, 257/E21.01, E21.281; 438/240, 778, 785
See application file for complete search history.

(56) References Cited

U.S. PATENT DOCUMENTS

2004/0043557 A1*   3/2004   Haukka et al. ............ 438/240

FOREIGN PATENT DOCUMENTS

| KR | 1020010063732 A | 7/2001 |
| KR | 1020040102277 A | 12/2004 |
| KR | 1020050101626 A | 10/2005 |
| KR | 1020060041355 A | 5/2006 |
| KR | 1020060052474 A | 5/2006 |
| KR | 100648860 B1 | 11/2006 |

* cited by examiner

*Primary Examiner*—Asok K Sarkar
(74) *Attorney, Agent, or Firm*—Volentine & Whitt, P.L.L.C.

(57) ABSTRACT

A method of forming a dielectric layer in a capacitor adapted for use in a semiconductor device is disclosed. The method includes forming a first $ZrO_2$ layer, forming an interfacial layer using a plasma treatment on the first $ZrO_2$ layer, and forming a second $ZrO_2$ layer on the interfacial layer.

1 Claim, 7 Drawing Sheets

METHOD MANUFACTURING CAPACITOR DIELECTRIC

CROSS REFERENCE TO RELATED APPLICATION

This application claims priority to Korean Patent Application No. 10-2006-0117179 filed Nov. 24, 2006, the subject matter of which is hereby incorporated by reference.

BACKGROUND OF THE INVENTION

1. Field of the Invention

The present invention relates to semiconductor devices and a method of manufacturing same. More particularly, the invention relates to a method of manufacturing a capacitor dielectric layer for use in a semiconductor device having improved leakage current characteristics.

2. Description of the Related Art

In recent years, the demand for densely integrated, high-performance semiconductor devices has remained unabated. In the context of semiconductor memory devices, these demand drivers implicate the design and fabrication of the capacitor constituent to each memory cell. Among the other components forming the individual memory cells of a semiconductor memory device, the size of the capacitor tends to dominate the design and particular attention must be paid to the capacitance per unit area occupied by the capacitor. That is, even though the size of the capacitor has been decreased, its capacitance must remain sufficiently high to ensure proper operation of the device, while its breakdown voltage must also remain sufficiently high to ensure device reliability. One approach to maximizing capacitance of a capacitor having a reduced physical size focuses on the dielectric material separating the capacitor's lower electrode from its upper electrode.

Following recent developments along this line, when a single zirconium oxide layer ($ZrO_2$) is used as a capacitor dielectric layer in an MIM capacitor, its equivalent oxide thickness (hereinafter, referred to as "Toxeq") is excellent, but its leakage current characteristics are poor. (The equivalent oxide thickness, Toxeq, is a comparative metric for a dielectric layer expressed in terms of silicon oxide, i.e., a metric stating an equivalent thickness of silicon oxide necessary to provide the same capacitance).

Accordingly, high dielectric layers having a composite material structure, such as a $ZrO_2$ and aluminum oxide layer ($Al_2O_3$) or "ZAZ layer", have been proposed. Unfortunately, such composite material layers are generally thicker than a single $ZrO_2$ dielectric layer. This increased thickness of the dielectric layer is at odds with ongoing design imperatives to reduce the overall size of constituent components including the capacitor.

SUMMARY OF THE INVENTION

In one embodiment, the invention provides a method of forming a dielectric layer in a semiconductor device, the method comprising; forming a first $ZrO_2$ layer, forming an interfacial layer using a plasma treatment on the first $ZrO_2$ layer, and forming a second $ZrO_2$ layer on the interfacial layer.

In another embodiment, the invention provides a method of forming a capacitor in a semiconductor device, the method comprising; forming a lower electrode on a semiconductor substrate, forming a first dielectric layer on the lower electrode, and forming an upper electrode on the dielectric layer, wherein forming the first dielectric layer comprises; forming a first $ZrO_2$ layer, forming an interfacial layer using a plasma treatment on the first $ZrO_2$ layer, and forming a second $ZrO_2$ layer on the interfacial layer.

In a related embodiment, method further comprises forming a second dielectric layer above or below the first dielectric layer, wherein the second dielectric layer comprises at least one of a $Al_2O_3$ layer or a $TiO_2$ layer. The combination of first and second dielectric layers may form in certain embodiments one selected from a group consisting of a $ZrO_2/Al_2O_3$ layer, a $ZrO_2/Al_2O_3/ZrO_2$ layer, a $ZrO_2/Al_2O_3/TiO_2$ layer, a $ZrO_2/TiO_2$ layer, and a $ZrO_2/TiO_2/Al_2O_3$ layer.

DESCRIPTION OF EMBODIMENTS

Figure 1:
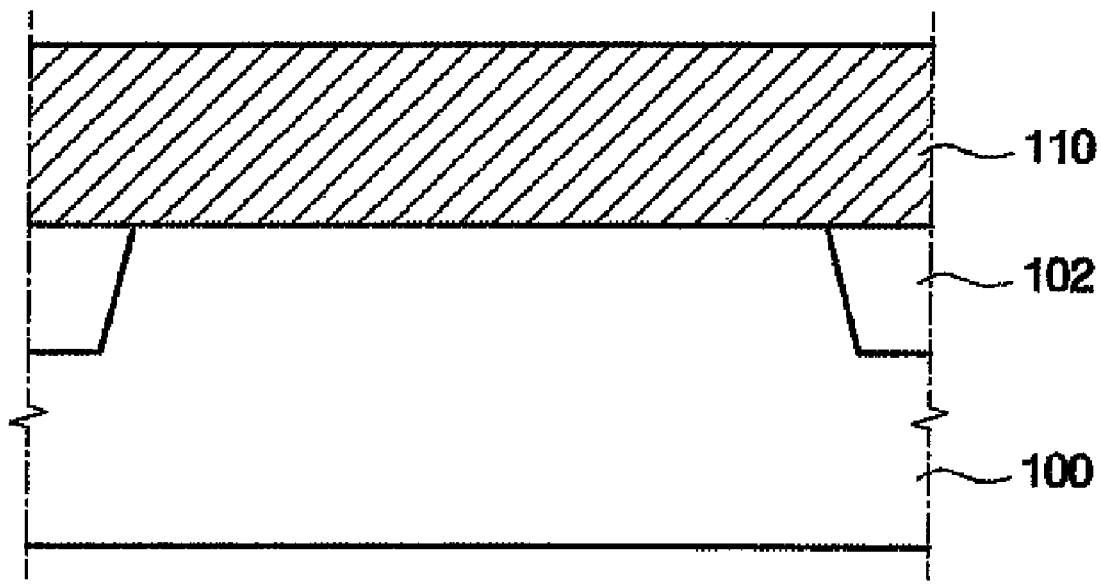
FIGS. 1 to 4 are views sequentially illustrating a method of manufacturing a semiconductor device according to an embodiment of the invention.
Figure 2:
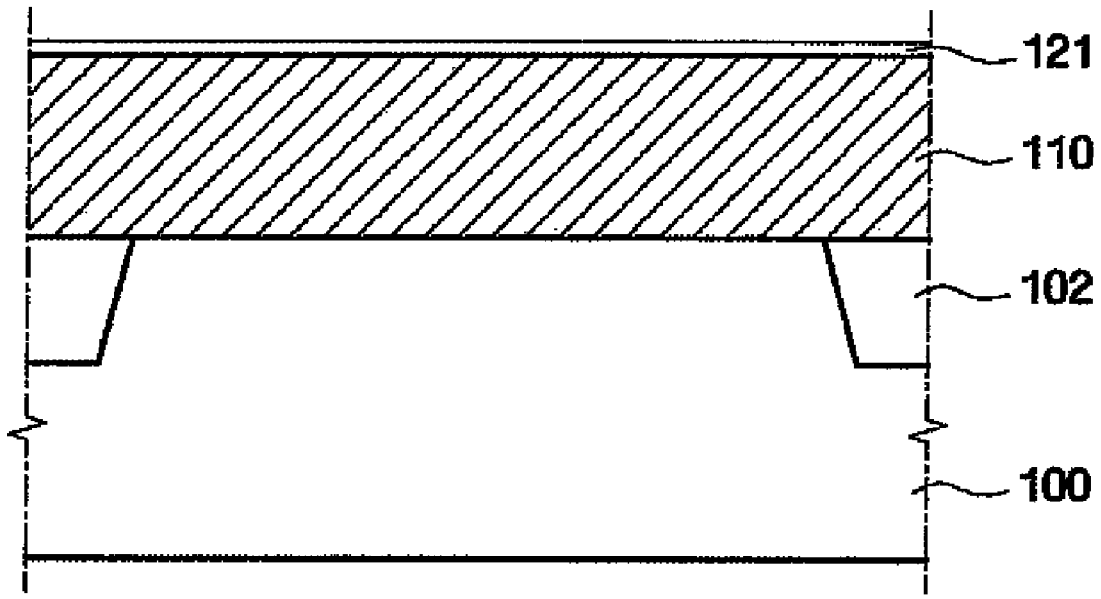

Embodiments of the invention will now described with reference to the accompanying drawings. The present invention may, however, be embodied in many different forms and should not be construed as being limited to only the illustrated embodiments. Rather, these embodiments are presented as teaching examples. Throughout the written description and drawings, like reference numerals refer to like or similar elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout. As used herein, the term "and/or" includes any and all combinations of one or more of the associated listed items.

Terms such as first and second are used to describe various elements, components, regions, wires, layers, and/or sections. However, the elements, components, regions, wires, layers, and/or sections are not limited by the terms. The terms are used to merely distinguish an element, component, region, wire, layer, or section from other elements, components, regions, wires, layers, or sections. Accordingly, a first element, first component, first region, first wire, first layer, or first section may be a second element, second component, second region, second wire, second layer, or second section, without departing from the scope and spirit of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

The terminology used herein is for the purpose of describing particular embodiments only and is not intended to be limiting of the invention. The use of singular terms in the context of describing the invention is also to be construed to cover the plural, unless otherwise indicated herein or clearly contradicted by context. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As long as not being specially defined, all terms (including technical and scientific terms) used in the context of describing the invention may be commonly understood to those skilled in the art. Further, as long as not being specially defined, terms that are widely used and defined in a dictionary are not ideally or exaggeratedly interpreted.

Preferred embodiments of the invention will be described below with reference to cross-sectional views, which are exemplary drawings of the invention. The exemplary drawings may be modified by manufacturing techniques and/or tolerances. Accordingly, the preferred embodiments of the invention are not limited to specific configurations shown in the drawings, and include modifications based on the method of manufacturing the semiconductor device. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

A method of manufacturing a semiconductor device according to an embodiment of the invention will now be described with reference to FIGS. 1 through 4.

First, as shown in FIG. 1, an element isolation process defining an active region in a semiconductor substrate 100 is performed. That is, an active region of substrate 100 is defined between element isolation regions 102. A LOCOS (Local Oxidation of Silicon) process or STI (Shallow Trench Isolation) process may be used to form the element isolation regions 102.

Subsequently, a first conductive layer ultimately forming a lower electrode 110 is formed on substrate 100.

In the illustrated example, a TiN layer made of a heat resistant metal compound is assumed as the first conductive layer used to form lower electrode 110. The TiN layer used as the first conductive layer for forming lower electrode 110 may be formed by an atomic layer deposition (ALD) process, a physical vapor deposition (PVD) process, or a chemical vapor deposition (CVD) process. In the illustrated example, the first conductive layer forming lower electrode 110 is shown as a flat MIM capacitor for convenience of description. However, the shape of this conductive layer is not limited to only this type. Rather, the conductive layer may be implemented with a three-dimensional structure, such as a cylindrical structure.

Alternately, the first conductive layer forming lower electrode 110 may be formed by one or more materials such as TaN, WN, RuN, Pt, Ir, $RuO_2$, $IrO_2$, $SrRuO_3$, and/or TiAlN.

Following formation of the first conductive layer forming lower electrode 110, a first $ZrO_2$ layer 121 and an interfacial layer 122 are sequentially formed.

First $ZrO_2$ layer 121 may be formed using an ALD process providing excellent step coverage at a relatively low application temperature. In one embodiment, first $ZrO_2$ layer 121 may be formed to a thickness ranging between about 10 to 90 Å. However, first $ZrO_2$ layer 121 may be formed to a thickness equal to or less than the subsequently formed second $ZrO_2$ layer 123.

Conventionally, as a $ZrO_2$ dielectric layer is formed, $O_3$ gas is applied to the upper surface of the first conductive layer forming lower electrode 110. For this reason, an oxide layer is formed on the upper surface of the first conductive layer forming lower electrode 110. As a result, the interlayer surface characteristic (or interfacial characteristic) of the $ZrO_2$ dielectric layer is degraded. According to one embodiment of the invention, as first $ZrO_2$ layer 121 is formed, some $O_3$ gas is still applied to the upper surface of the conductive layer. However, since first $ZrO_2$ layer 121 is relatively thin, the amount of $O_3$ gas being applied is comparatively less than the conventional approach.

Interfacial layer 122 may be formed on first $ZrO_2$ layer 121 by a plasma treatment using one or more gas(es) selected from a group consisting of $N_2$, $H_2$, $NH_3$, $O_2$, and Ar. In one embodiment of the invention, the plasma treatment is performed at a temperature ranging between about 25 to 300° C. with a flux ranging from about 50 sccm to 1 slm. Interfacial layer 122 may be formed to a thickness of several Å, and in one embodiment may be formed to a thickness ranging from about 2 to 3 Å. Interfacial layer 122 should be much thinner than first $ZrO_2$ layer 121. In one embodiment, the thickness ratio between first $ZrO_2$ layer 121 and interfacial layer 122 will be 5 or more. In some fabrication options, if it is possible to completely exhaust the source gas following formation of first $ZrO_2$ layer 121, it will be possible to perform the plasma treatment forming interfacial layer 122 using an in-situ process.

Figure 3:
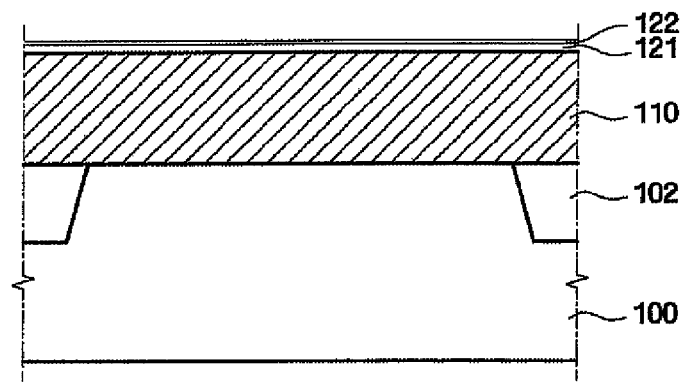

Referring to FIG. 3, following formation of interfacial layer 122, a second $ZrO_2$ layer 123 is formed to complete a dielectric layer 120.

Second $ZrO_2$ layer 123 may be formed using the same process forming first $ZrO_2$ layer 121 (e.g., an ALD process forming second $ZrO_2$ layer 123 to a thickness ranging between about 10 to 90 Å). However, second $ZrO_2$ layer 123 may be formed with a thickness greater than that of first $ZrO_2$ layer 121. As before, the formation of second $ZrO_2$ layer 123 may result in the application of $O_3$ gas. However, since second $ZrO_2$ layer 123 is formed with a thickness less than the conventional $ZrO_2$ dielectric layer, the amount of applied $O_3$ gas will be less. Further, the presence of interfacial layer 122 below second $ZrO_2$ layer 123 prevents the $O_3$ gas from penetrating down to the upper surface of first $ZrO_2$ layer 121 and/or the first conductive layer forming lower electrode 110. That is, interfacial layer 122 acts as a barrier layer preventing the ingress of $O_3$ gas during formation of second $ZrO_2$ layer 123.

Of note the laminated nature of dielectric layer 120, as formed from first $ZrO_2$ layer 121, interfacial layer 122, and second $ZrO_2$ layer 123, nonetheless results in a thickness substantially the same as the conventional single-layer $ZrO_2$ dielectric layer. Yet, it yields a much improved Toxeq.

In addition, because the ALD process being used to form first and second $ZrO_2$ layers 121 and 123 forms relatively thinner layers, it is possible to better control the flow of $O_3$ gas and mitigate its effect within the overall fabrication process. This effect arises in part from the operation of interfacial layer 122 as a barrier layer inhibiting the penetration of $O_3$ gas into first $ZrO_2$ layer 121. As a result, it is possible to form dielectric layer 120 with improved leakage current characteristics.

Figure 4:
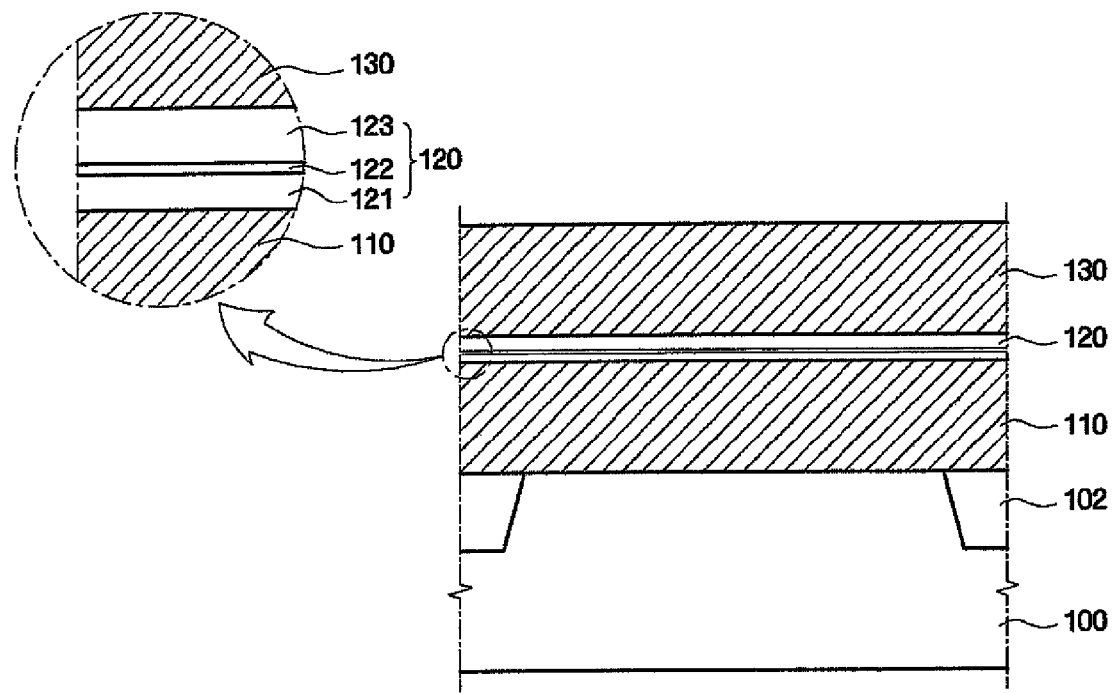

Referring to FIG. 4, a second conductive layer forming an upper electrode 130 is formed on second $ZrO_2$ layer 123 of dielectric layer 120.

The second conductive layer forming upper electrode 130 may be formed from similar material(s) and using similar processes as those described above in relation to first conductive layer forming lower electrode 110.

Following the formation of the second conductive layer forming upper electrode 130, a patterning process may be conventionally performed to complete fabrication of a MIM capacitor.

The foregoing embodiment describes that use of upper and lower $ZrO_2$ layers sandwiching an interfacial layer to form a dielectric layer. However, the invention is not limited to only this design alternative. For example, one or both of the $ZrO_2$ layers may be replaced with a composite layer formed from an $Al_2O_3$ layer or a $TiO_2$ layer.

Further, although an MIM capacitor has been described above, the present invention may be applied to other capacitor types such as a PIP or MIP capacitor. In addition, a dielectric layer formed in accordance with an embodiment of the invention may be used in any semiconductor device element or feature benefiting from a dielectric layer having excellent leakage current characteristics.

Figure 5:
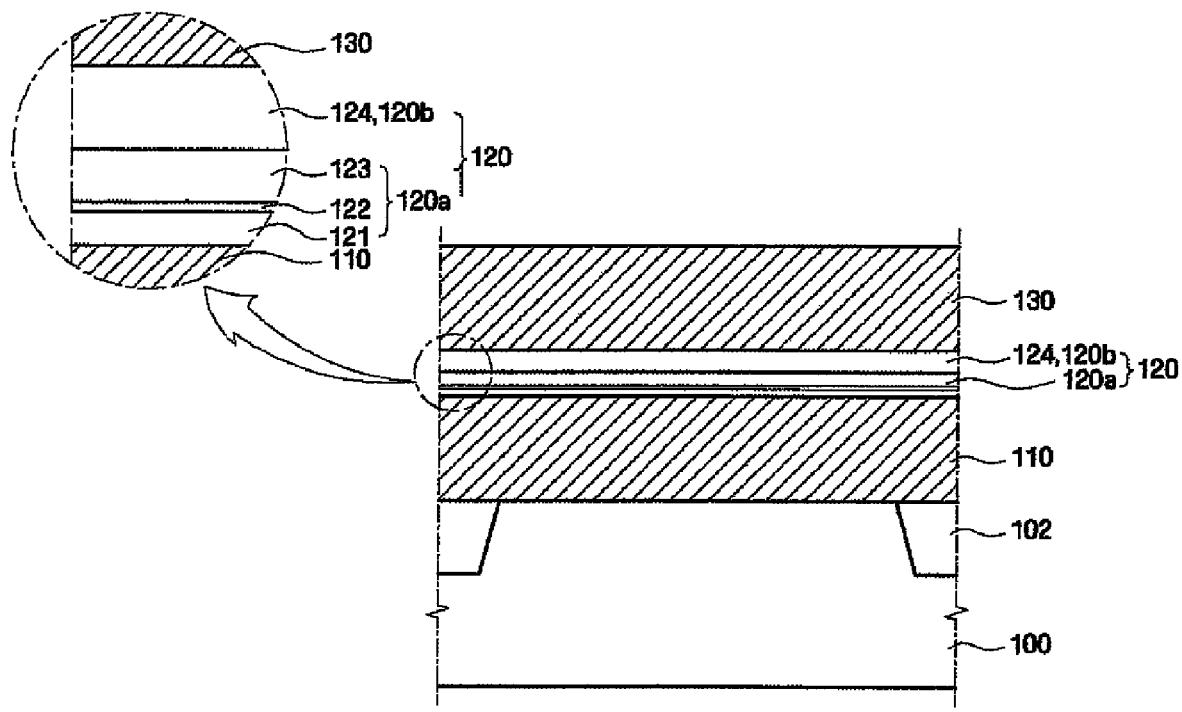
FIG. 5 is a cross-sectional view of a semiconductor device according to another embodiment of the invention.
Figure 6:
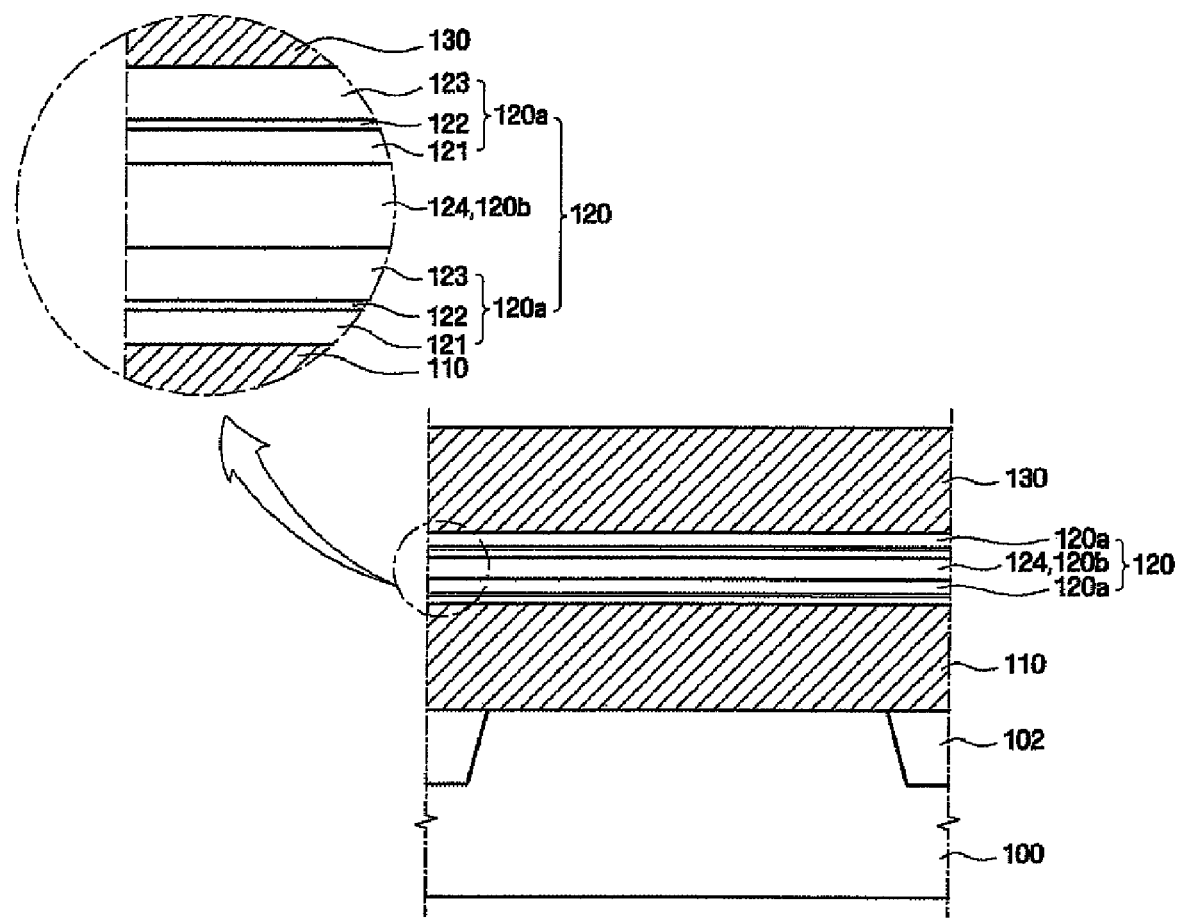
FIG. 6 is a cross-sectional view of a semiconductor device according to another embodiment of the invention.
Figure 7:
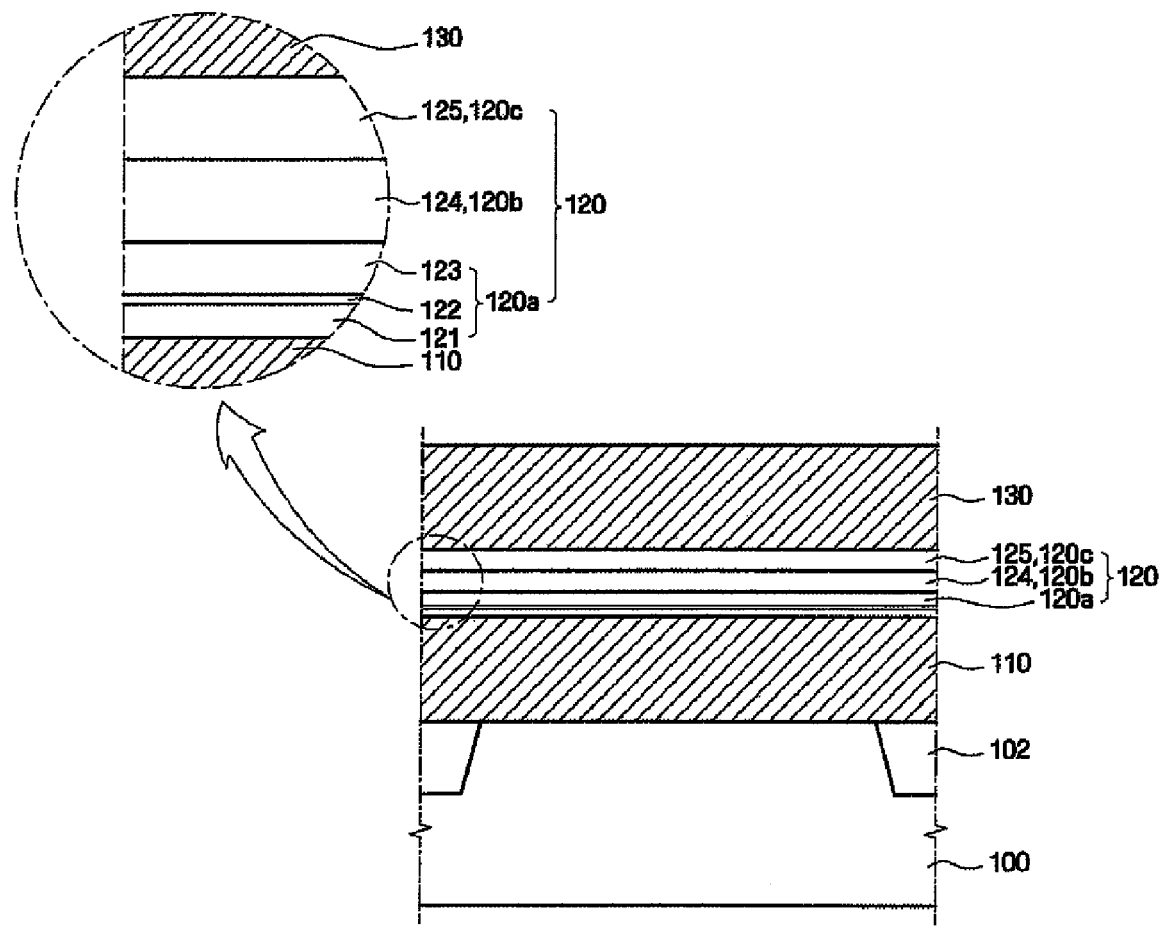
FIG. 7 is a cross-sectional view of a semiconductor device according to another embodiment of the invention.

FIGS. 5, 6 and 7 are respective cross-sectional views of semiconductor devices designed and fabricated according to other embodiments of the invention.

FIG. 5 shows an embodiment of the invention comprising a composite dielectric layer 120. Dielectric layer 120 may be formed by laminating a first dielectric layer 120a to a second dielectric layer 120b, wherein first dielectric layer 120a has the structure noted above including first $ZrO_2$ layer 121, interfacial layer 122 and second $ZrO_2$ layer 123.

Second dielectric layer 120b may be formed from a single material layer 124 such as an $Al_2O_3$ layer, a $TiO_2$ layer, etc. By means of this type of composite dielectric layer it is possible to obtain a semiconductor device having improved leakage current characteristic.

FIG. 6 shows an embodiment of the invention wherein the composite dielectric layer 120 includes upper and lower first dielectric layers 120a sandwiching a second dielectric layer 120b. Each first dielectric layer 120a has the same structure noted above, including first $ZrO_2$ layer 121, interfacial layer 122 and second $ZrO_2$ layer 123, and the second dielectric layer 120b may be formed from a single layer dielectric material such as $Al_2O_3$, $TiO_2$, etc. This composite dielectric layer may be used, for example, as a replacement for ZAZ dielectric layer structures ($ZrO_2/Al_2O_3/ZrO_2$) that are conventionally present in some devices.

FIG. 7 shows an embodiment of the invention comprising a composite dielectric layer 120. Dielectric layer 120 may be formed by laminating a first dielectric layer 120a, a second dielectric layer 120b, and a third dielectric layer 120c. Here again, first dielectric layer 120a has the structure noted above including first $ZrO_2$ layer 121, interfacial layer 122 and second $ZrO_2$ layer 123. Second dielectric layer 124 and third dielectric layer 125 may be sequentially laminated to first dielectric layer 120a including interfacial layer 122.

In this case, one or both of the second dielectric layer 124 and third dielectric layer 125 may be formed from $Al_2O_3$, $TiO_2$ layer, or the like, but is not limited thereto. Further, dielectric layer 120 according this embodiment of the invention may be a $ZrO_2/Al_2O_3/TiO_2$ layer or $ZrO_2/TiO_2/Al_2O_3$ layer. Accordingly, the single $ZrO_2$ layer 120a interposing an interfacial layer according to the embodiment of the invention is applied to a composite dielectric layer as well as a single $ZrO_2$ layer 120a interposing an interfacial layer. For this reason, it is possible to improve leakage current characteristics. Further, it is possible to improve Toxeq of the composite dielectric layer, which is inferior to that of a single $ZrO_2$ layer. This will be described in some additional detail with reference to the following specific experimental examples.

Figure 8A:
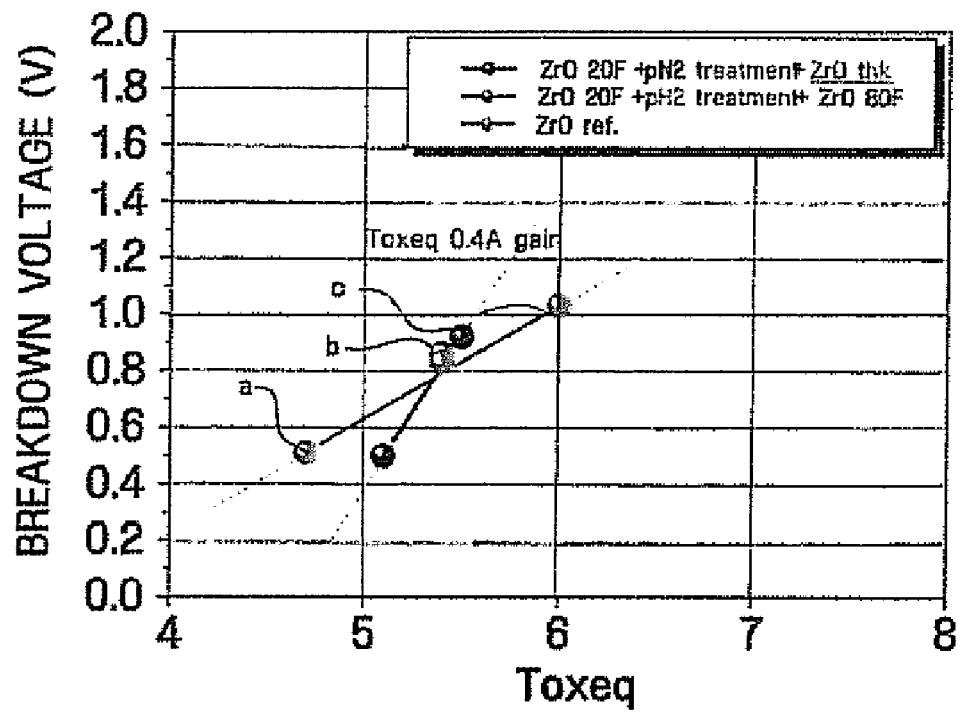
FIGS. 8A and 8B are graphs illustrating the relationship between the equivalent of oxide thickness and the breakdown voltage for a conventional dielectric layer and a dielectric layer according to an embodiment of the invention.
Figure 8B:
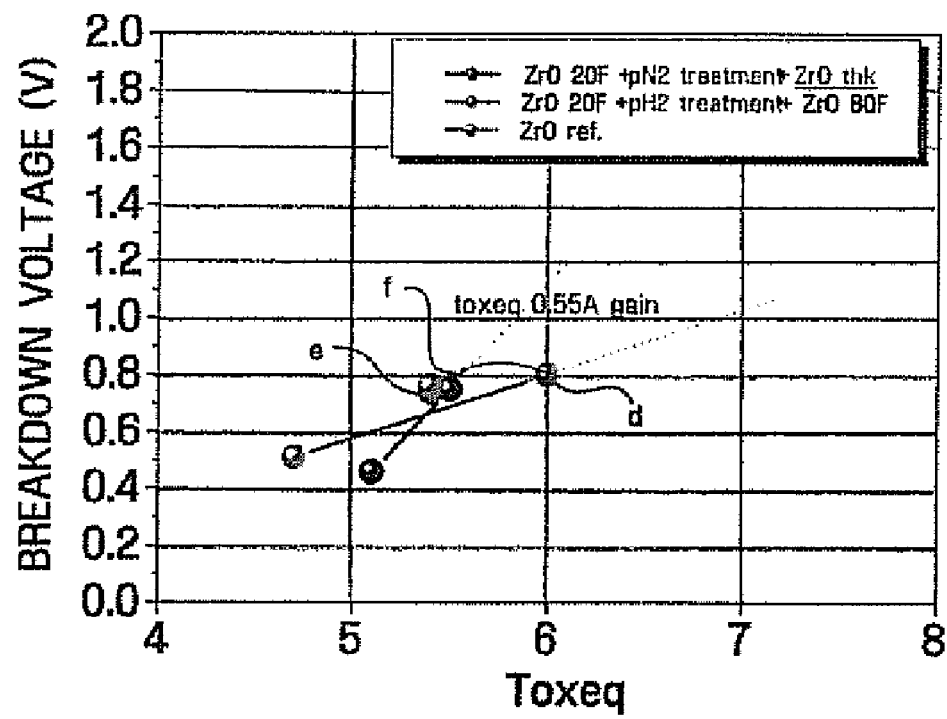

FIG. 8A and FIG. 8B are graphs illustrating a relationship between equivalent of oxide thickness and breakdown voltage for a conventional dielectric layer and a dielectric layer including an interfacial layer according to an embodiment of the invention.

In FIG. 8A, reference indicator "a" indicates a dielectric layer formed from only $ZrO_2$ and having a thickness of 80 Å. Reference indicator "b" indicates a dielectric layer including an interfacial layer formed between a first $ZrO_2$ layer having a thickness of 10 Å, and a second $ZrO_2$ layer having a thickness of 70 Å, wherein the interfacial layer is formed by a plasma treatment using $H_2$. Finally, reference indicator "c" indicates a dielectric layer formed similarly to that of "b". However, the gas used in the plasma treatment for the dielectric layer in "b" is different from the gas used in the plasma treatment for the dielectric layer in "c".

The thickness of the dielectric layer "a" is 95.78 Å, while the thicknesses of the dielectric layers "b" and "c" are 94.73 Å.

The X-axis of FIG. 8A represents an equivalent of oxide thickness, Toxeq. The Y-axis of FIG. 8A represents a breakdown voltage during the application of a positive voltage. That is, the Y-axis represents a breakdown voltage in which leakage current of 1 fA flows in each unit cell during the application of a positive voltage. In this case, the degree of improvement in Toxeq will be described with respect to 1 V that is a median on the Y-axis. As shown in FIG. 8A, Toxeq of the dielectric layer "a" is about 6 Å with respect to a breakdown voltage of 1 V in which the same leakage current flows. However, since the inclination of a linear graph of the dielectric layer "b" is substantially the same as that of the dielectric layer "c", Toxeq of each of the dielectric layers "b" and "c" is about 5.6 Å. For this reason, when a dielectric layer is formed of a $ZrO_2$ layer interposing an interfacial layer according to the embodiment of the invention, it is understood that Toxeq is about 0.4 Å with respect to a breakdown voltage in which the same leakage current flows.

That is, it is understood that Toxeq is further improved as compared to the conventional approach. In contrast, when a dielectric layer is formed of a $ZrO_2$ layer interposing an interfacial layer so as to have the same Toxeq as the single dielectric layer in the related art, a breakdown voltage that can be withstood by a capacitor can be expected to be increased as compared to the related art. In addition, it is understood that the kinds of gases used in a plasma treatment do not cause a material difference in the result during the formation of an interfacial layer. That is, it is understood that it is important to form an interfacial layer by a plasma treatment but the kinds of gases used in a plasma treatment do not cause significant difference in the result.

FIG. 8B is a graph illustrating a relationship between the equivalent of oxide thickness and the breakdown voltage for a conventional dielectric layer and for a dielectric layer including an interfacial layer according to the embodiment of the invention when a negative voltage is applied to the dielectric layers.

Referring to FIG. 8B, first, reference indicator "d" indicates a dielectric layer formed under the same conditions as the dielectric layer "a" shown in FIG. 8A, reference indicator "e" indicates a dielectric layer including an interfacial layer formed under the same conditions as the dielectric layer "b" shown in FIG. 8A, and reference indicator "f" indicates a dielectric layer including an interfacial layer formed under the same conditions as the dielectric layer "c" shown in FIG. 8A.

Again, the X-axis of FIG. 8B represents an equivalent of oxide thickness, Toxeq. The Y-axis of FIG. 8B represents a breakdown voltage during the application of a negative voltage. That is, the Y-axis represents a breakdown voltage in which leakage current of 1 fA flows into each unit cell during the application of a negative voltage. In FIG. 8B, the degree of improvement in Toxeq will be described with respect to 0.8 V on the Y-axis. As shown in FIG. 8B, Toxeq of the dielectric layer "e" is about 6 Å with respect to a breakdown voltage of 0.8 V in which the same leakage current flows. However, since the inclination of a linear graph of the dielectric layer "e" is substantially the same as that of the dielectric layer "f", Toxeq of each of the dielectric layers "e" and "f" is about 5.45 Å.

For this reason, when a dielectric layer is formed of a $ZrO_2$ layer interposing an interfacial layer according to the embodiment of the present invention, it is understood that Toxeq is about 0.55 Å with respect to a breakdown voltage in which the same leakage current flows during the application of a negative voltage. That is, it is understood that Toxeq is improved. Accordingly, it is possible to understand that Toxeq with respect to a breakdown voltage is improved during the application of both a positive voltage and a negative voltage. That is, when a dielectric layer including an interfacial layer according to the embodiment of the present invention is used, it is possible to obtain an MIM capacitor that stably operates.

Figure 9:
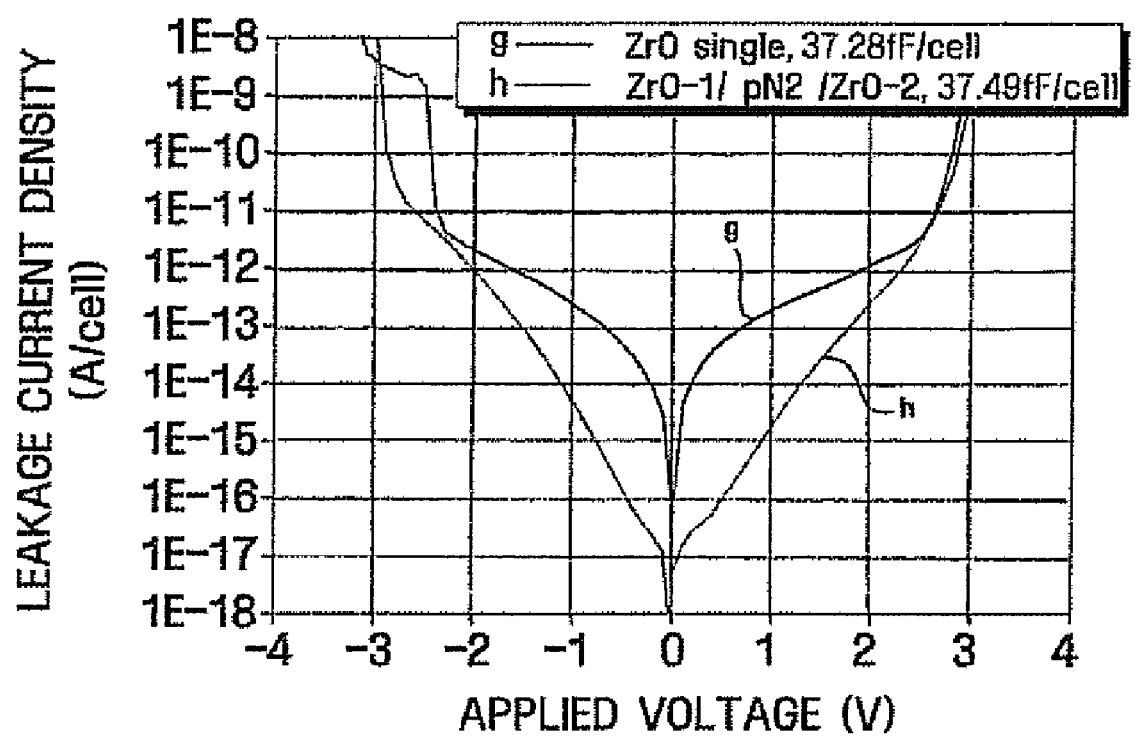
FIG. 9 is a graph illustrating the relationship between an applied voltage and the leakage current density for a conventional dielectric layer and a dielectric layer according to an embodiment of the invention.

FIG. 9 is a graph showing a relationship between applied voltage and leakage current density for a conventional dielectric layer and a dielectric layer including an interfacial layer according to the embodiment of the invention.

First, reference indicator "g" indicates a single layer dielectric formed from only $ZrO_2$. In this case, capacitance is 37.28 fF per unit cell. In contrast, reference indicator "h" indicates a dielectric layer including two $ZrO_2$ layers sandwiching an interfacial layer. In this case, capacitance is 37.49 fF per unit cell. In this way, since the dielectric layer including the interfacial layer is formed to have the same capacitance as the conventional dielectric layer, it is possible to obtain a similar Toxeq.

The X-axis of FIG. 9 represents an applied voltage and the Y-axis represents a leakage current density per unit cell. In this case, it can be understood that the dielectric layer "g" has an order of the current density lower than that of the dielectric layer "h" with respect to an applied voltage of 1 V (see ΔA/cell).

The leakage current density relates to an electrical characteristic and a power consumption of a capacitor, and it is preferable that the leakage current density be low in respect to the electrical characteristic of a semiconductor device. Accordingly, when a dielectric layer is formed of twin $ZrO_2$ layers sandwiching an interfacial layer according the embodiment of the invention, a $ZrO_2$ layer is formed by two processes unlike the single $ZrO_2$ layer of the conventional approach. For this reason, it is possible to avoid the use of relatively large amounts of $O_3$. Further, since an interfacial layer having a barrier characteristic is formed between the first and second $ZrO_2$ layers, it is possible to prevent $O_3$ from flowing in the first $ZrO_2$ layer. As a result, it is possible to improve the interfacial characteristic against the conductive layer for a lower electrode 110.

For this reason, even though a dielectric layer is formed of a single $ZrO_2$ layer interposing an interfacial layer, the leakage current characteristic is improved. As a result, it is possible to obtain a semiconductor device including a capacitor that stably operates. Further, since the leakage current characteristic is improved, it is possible to reduce Toxeq. For this reason, if the dielectric layer 120a including an interfacial layer according to the embodiment of the present invention is applied to the combined high dielectric layer disadvantageous in respect to Toxeq, it is possible to improve the Toxeq.

Although the present invention has been described in connection with the exemplary embodiments of the present invention, it will be apparent to those skilled in the art that various modifications and changes may be made thereto without departing from the scope of the invention. Therefore, it should be understood that the above embodiments are not limitative, but illustrative in all aspects.

What is claimed is:

1. A dielectric layer in a semiconductor device, the dielectric layer comprising:
   a semiconductor substrate;
   a conductive layer formed on the semiconductor substrate;
   a first $ZrO_2$ layer formed on the conductive layer;
   an interfacial layer including ZrON formed on the first $ZrO_2$ layer; and
   a second $ZrO_2$ layer formed on the interfacial layer, wherein the interfacial layer prevents $O_3$ from penetrating the first $ZrO_2$ layer to reach the conductive layer during formation of the second $ZrO_2$ layer.

* * * * *